United States Patent
Hou et al.

(10) Patent No.: US 10,187,984 B1
(45) Date of Patent: Jan. 22, 2019

(54) CIRCUIT BOARD AND METHOD FOR MAKING THE SAME

(71) Applicants: Avary Holding (Shenzhen) Co., Limited., Shenzhen (CN); HongQiSheng Precision Electronics (QinHuangDao) Co., Ltd., Qinhuangdao (CN)

(72) Inventors: Ning Hou, Shenzhen (CN); Si-Hong He, Shenzhen (CN); Biao Li, Shenzhen (CN); Mei-Hua Huang, Shenzhen (CN)

(73) Assignees: Avary Holding (Shenzhen) Co., Limited., Shenzhen (CN); HongQiSheng Precision Electronics (QinHuangDao) Co, Qinhuangdao (CN)

( * ) Notice: Subject to any disclaimer, the term of this patent is extended or adjusted under 35 U.S.C. 154(b) by 0 days.

(21) Appl. No.: 15/817,290

(22) Filed: Nov. 20, 2017

(30) Foreign Application Priority Data

Sep. 27, 2017 (CN) .......................... 2017 1 0891623

(51) Int. Cl.
    *H05K 1/09* (2006.01)
    *H05K 1/11* (2006.01)
    *H05K 3/40* (2006.01)
    *H05K 3/24* (2006.01)
    *H05K 3/06* (2006.01)

(52) U.S. Cl.
    CPC ............... *H05K 1/09* (2013.01); *H05K 1/115* (2013.01); *H05K 3/06* (2013.01); *H05K 3/241* (2013.01); *H05K 3/4038* (2013.01)

(58) Field of Classification Search
    CPC ........ H05K 3/4038; H05K 1/09; H05K 3/241; H05K 3/06; H05K 1/115
    USPC .......................................................... 174/257
    See application file for complete search history.

(56) References Cited

U.S. PATENT DOCUMENTS 3,786,172 A * 1/1974 Conley .................... B23K 1/20
                                                      174/257
3,850,711 A * 11/1974 Conley .................... H05K 1/09
                                                      216/18

* cited by examiner

Primary Examiner — Sherman Ng
(74) Attorney, Agent, or Firm — ScienBiziP, P.C.

(57) ABSTRACT

A circuit board film-plated against corrosion of conductive traces comprises a substrate, at least one conductive circuit layer attached to the substrate, at least one plating film attached to a surface of the conductive circuit layer away from the substrate, and a covering film. Each of the at least one plating film comprises a surface away from the conductive circuit layer, and at least one side surface. The circuit board defines at least one through hole. Each of the at least one through hole passes through substrate, conductive circuit layer, and the plating film. The covering film covers the conductive circuit layer, the side surface of the plating film, and the through hole. The film-covered conductive circuit layer and the film-covered side surface of the plating film cannot be corroded. A method for making the circuit board is also provided.

5 Claims, 6 Drawing Sheets

CIRCUIT BOARD AND METHOD FOR MAKING THE SAME

FIELD

The subject matter herein generally relates to a circuit board, and a method for making the circuit board.

BACKGROUND

Circuit board includes a copper conductive circuit layer, and a plating film attached to the copper conductive circuit layer. The plating film includes a nickel layer attached to the copper conductive circuit layer, and a gold layer attached to the nickel layer. The plating film can have fractured surface. Sometimes the fractured surface exposes the copper conductive circuit layer, the nickel layer, and the gold layer. When the fractured surface is exposed in a damp $H_2S$ gas atmosphere, the copper will react with the $H_2S$ as follows: $H_2S \leftrightarrow H^+ + HS^-$, $Cu + O_2 \rightarrow Cu^{2+}O$, $Cu^{2+}O + H_2S \rightarrow Cu_2S \downarrow + H_2O$, $Cu^{2+}O + O_2 \rightarrow CuO$, $CuO + H_2S \rightarrow CuS \downarrow + H_2O$, thus the copper conductive circuit layer will be corroded. Galvanic cell effect can occur at the interface of gold and nickel, and an interface of nickel and copper, to cause the nickel layer and the copper conductive circuit layer to corrode, thus the gold layer will fall off. Thus a new circuit board in which the nickel layer and the copper conductive circuit layer cannot be corroded is preferred.

BRIEF DESCRIPTION OF THE DRAWINGS

Implementations of the present disclosure will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to illustrate details and features of the present disclosure better. The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising" when utilized, means "including, but not necessarily limited to"; it specifically indicates open-ended inclusion or membership in the so-described combination, group, series, and the like.

Figure 1:
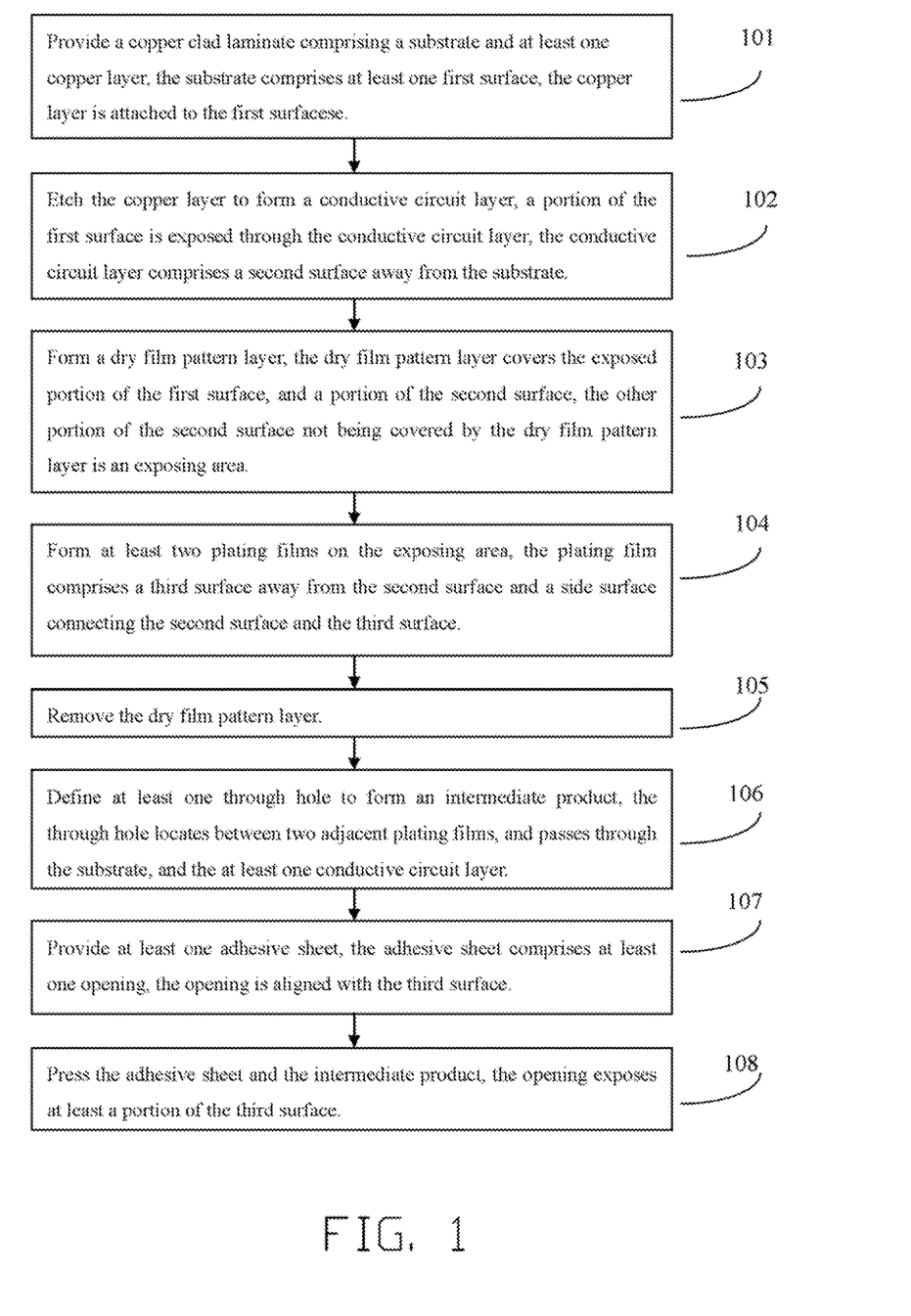
FIG. 1 is a flowchart of a method for making a circuit board in accordance with an exemplary embodiment.

FIG. 1 illustrates a flowchart of a method for making a circuit board 100 (shown in FIG. 12) in accordance with an exemplary embodiment. The exemplary method is provided by way of example, as there are a variety of ways to carry out the method. Each block shown in the figure represents one or more processes, methods, or subroutines, carried out in the exemplary method. Furthermore, the illustrated order of blocks is by example only and the order of the blocks can change. Additional blocks may be added or fewer blocks may be utilized, without departing from this disclosure. The exemplary method may begin at block 101.

Figure 2:
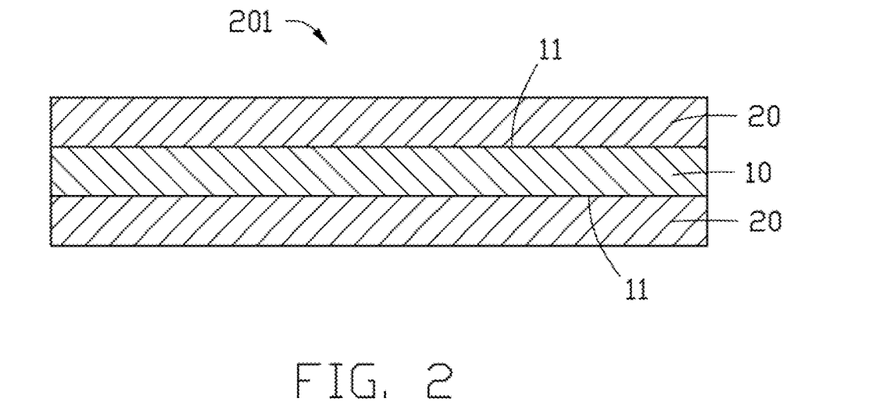
FIG. 2 is a diagrammatic view of a copper clad laminate of the circuit board of FIG. 1.

At block 101, referring to FIG. 2, a copper clad laminate 201 is provided. The copper clad laminate 201 includes a substrate 10, and at least one copper layer 20 attached to the substrate 10. The substrate 10 includes at least one first surface 11. Each copper layer 20 is attached to a first surface 11.

In at least one exemplary embodiment, the substrate 10 is a polyimide substrate.

Figure 3:
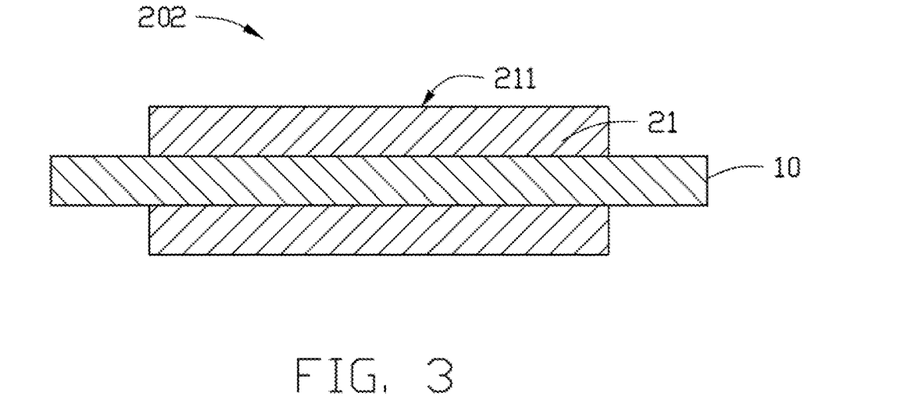
FIG. 3 is a diagrammatic view of a first intermediate product for the circuit board of FIG. 1.

At block 102, referring to FIG. 3, the copper layer 20 is made into a conductive circuit layer 21, thus a first intermediate product 202 is achieved.

The first intermediate product 202 includes the substrate 10 and at least one conductive circuit layer 21 attached to the substrate 10. A portion of the first surface 11 is exposed through the conductive circuit layer 21. The conductive circuit layer 21 includes a second surface 211 away from the substrate 10.

In at least one exemplary embodiment, a method for making the copper layer 20 into a conductive circuit layer 21 is by etching or laser cutting.

Figure 6:
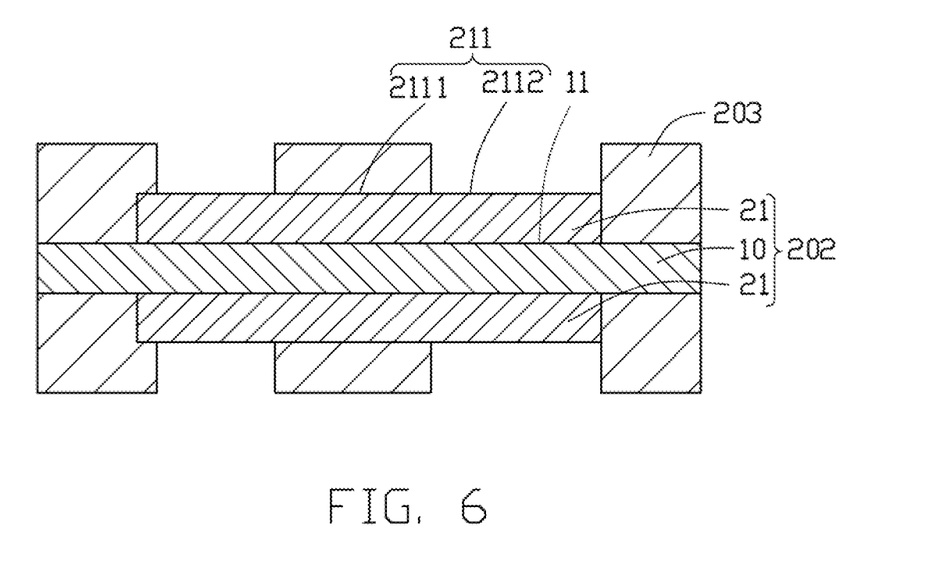
FIG. 6 is a diagrammatic view of the first intermediate product of FIG. 3 with a dry film pattern layer.

At block 103, referring to FIG. 6, a dry film pattern layer 203 is formed on the first intermediate product 202. The dry film pattern layer 203 covers the exposed portion of the first surface 11 and a portion of the second surface 211.

The portion of the second surface 211 covered by the dry film pattern layer 203 is a covering area 2111. The other portion of the second surface 211 which has not been covered by the dry film pattern layer 203 is an exposing area 2112.

Figure 4:
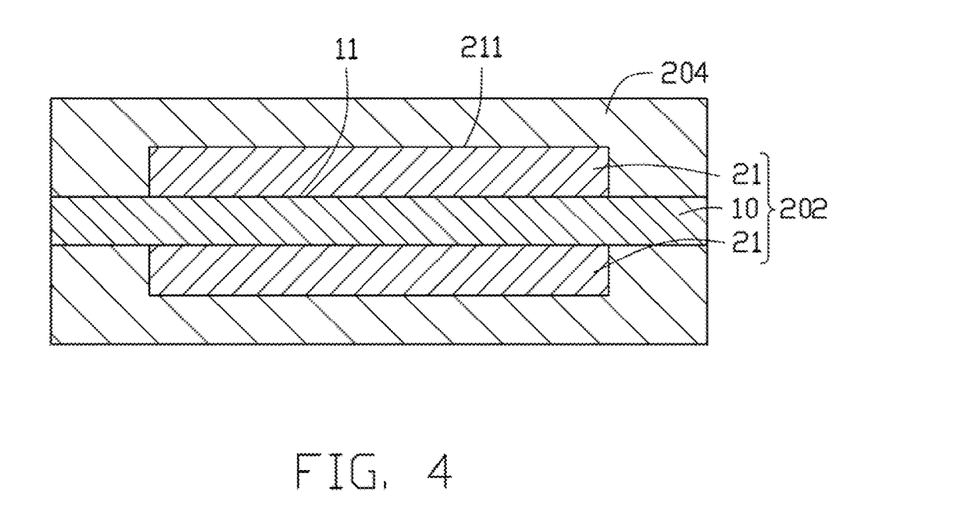
FIG. 4 is a diagrammatic view of the first intermediate product of the circuit board of FIG. 3 with a dry film.

In at least one exemplary embodiment, the dry film pattern layer 203 is formed by the following steps:

Referring to FIG. 4, a dry film 204 is attached to the first intermediate product 202. The dry film 204 covers the exposed portion of the first surface 11 and the second surface 211 of the conductive circuit layer 21.

Figure 5:
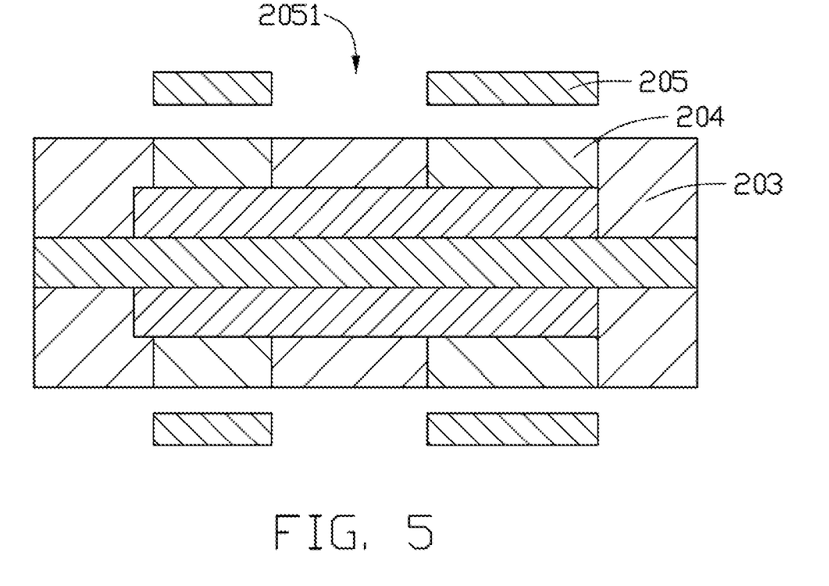
FIG. 5 is a diagrammatic view of the dry film of FIG. 4 being exposed in light.

Referring to FIG. 5, a light screen 205 is provided. The light screen 205 defines at least one light hole 2051. The light screen 205 is placed at a side of the dry film 204 away from the first intermediate product 202, and the light hole 2051 is aligned with the area of the dry film 204 which needs to be exposed to the light. Light is irradiated from a side of the light screen 205 away from the dry film 204, and a portion of the light passes through the light hole 2051 to strike the area of the dry film 204 needing to be exposed to the light.

Referring to FIG. 6, the other area of the dry film 204 which has not been exposed to the light is removed, thus a dry film pattern layer 203 attached to the first intermediate product 202 is achieved.

Figure 7:
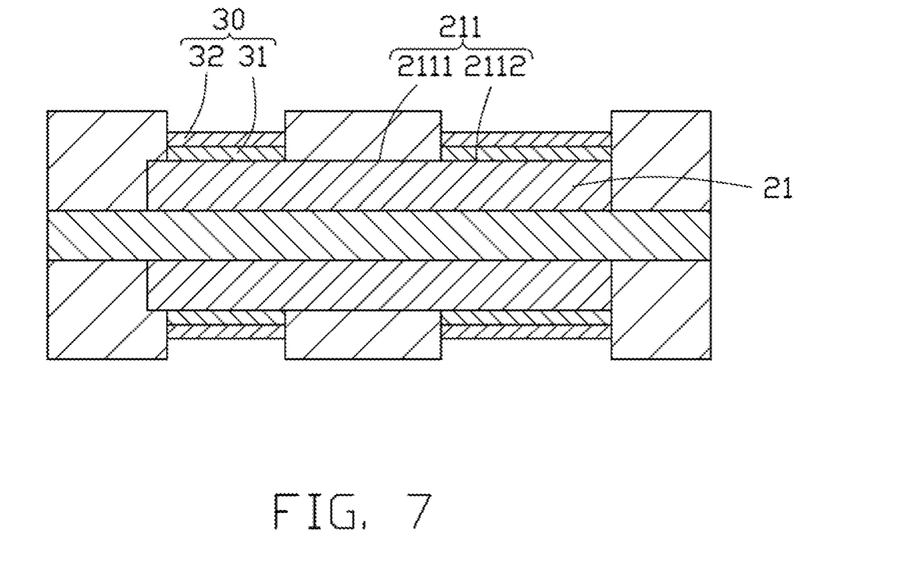
FIG. 7 is a diagrammatic view of a plating film attached to an exposing area of the second surface of FIG. 6.

At block 104, referring to FIG. 7, at least two plating films 30 are formed on the exposing area 2112 of the second surface 211.

In at least one exemplary embodiment, the plating film 30 includes a nickel layer 31 attached to the exposing area 2112 of the second surface 211, and a gold layer 32 attached to a surface of the nickel layer 31 away from the second surface 211.

Figure 8:
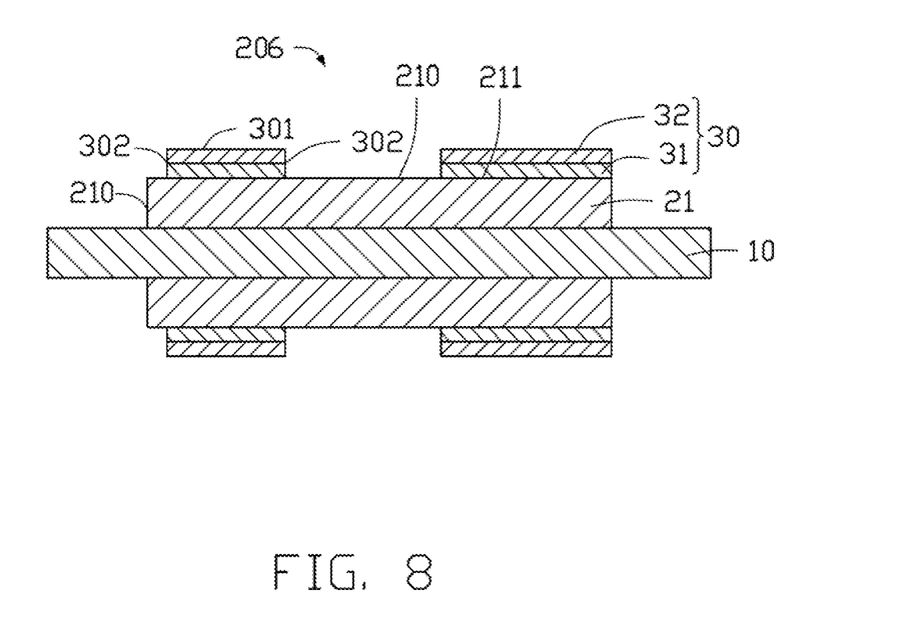
FIG. 8 is a diagrammatic view of a second intermediate product for the circuit board of FIG. 1.

At block 105, referring to FIG. 8, the dry film pattern layer 203 is removed, thus a second intermediate product 206 is achieved.

The second intermediate product 206 includes the substrate 10, at least one conductive circuit layer 21 attached to the substrate 10, and at least two plating films 30 attached to the second surface 211 of the conductive circuit layer 21. The conductive circuit layer 21 has an exposing surface 210 which is not attached with the substrate 10 and the plating film 30.

The plating film 30 includes a third surface 301 away from the conductive circuit layer 21, and at least one side surface 302. The side surface 302 connects the third surface 301 and the second surface 211 of the conductive circuit layer 21.

Figure 9:
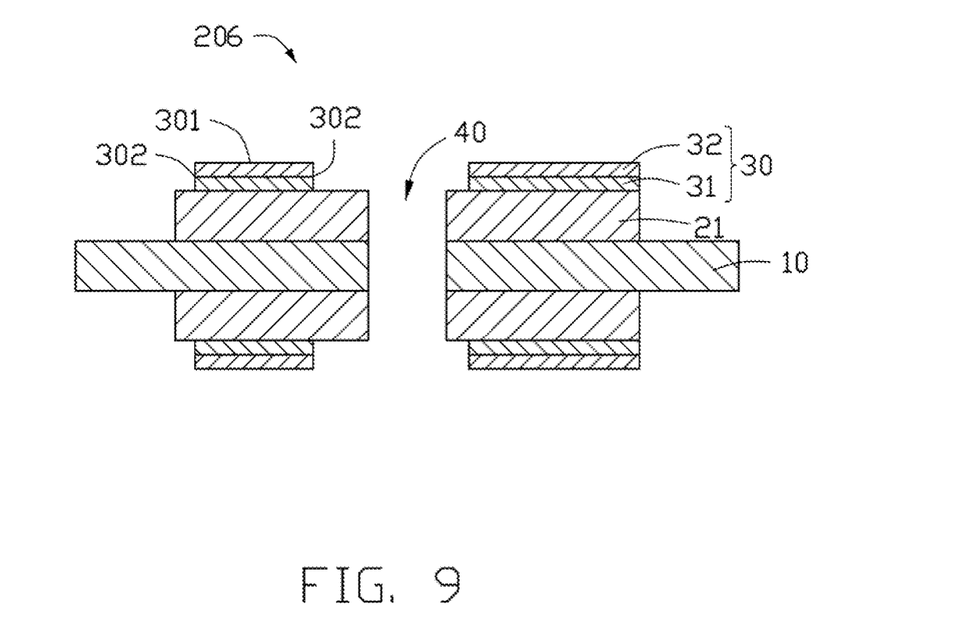
FIG. 9 is a diagrammatic view of the second intermediate product of FIG. 8 with a through hole.

At block 106, referring to FIG. 9, at least one through hole 40 is defined on the second intermediate product 206. Each through hole 40 is located between two adjacent plating films 30, in other words, an opening of each through hole 40 is located between two adjacent plating films 30. The through hole 40 passes through the substrate 10 and the at least one conductive circuit layer 21.

The through hole 40 includes a side wall 41.

In at least one exemplary embodiment, a method for defining the through hole 40 is by etching or laser cutting.

Figure 10:
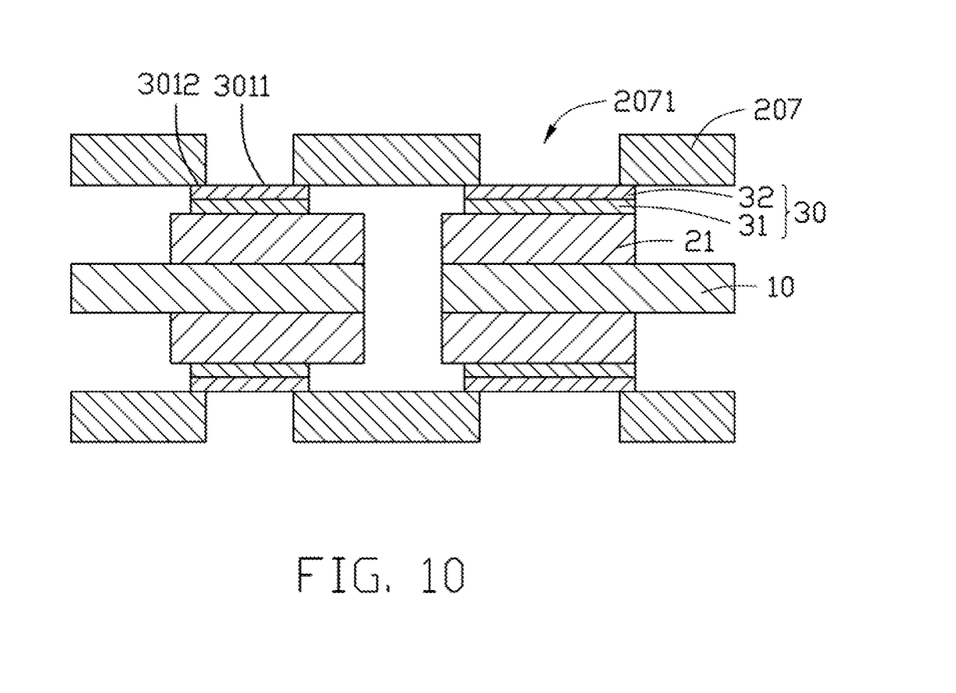
FIG. 10 is a diagrammatic view of adhesive sheet attached to the second intermediate product of FIG. 9.

At block 107, referring to FIG. 10, at least one adhesive sheet 207 is provided, and attached to a side of the second intermediate product 206. The adhesive sheet 207 includes at least one opening 2071. Each opening 2071 is aligned with the third surface 301 of a plating film 30. The other portion of the adhesive sheet 207 is aligned with the exposed portion of the first surface 11, with an area of the surface of the conductive circuit layer 21 away from the substrate 10 not attached with the plating film 30, and with the through hole 40.

Figure 11:
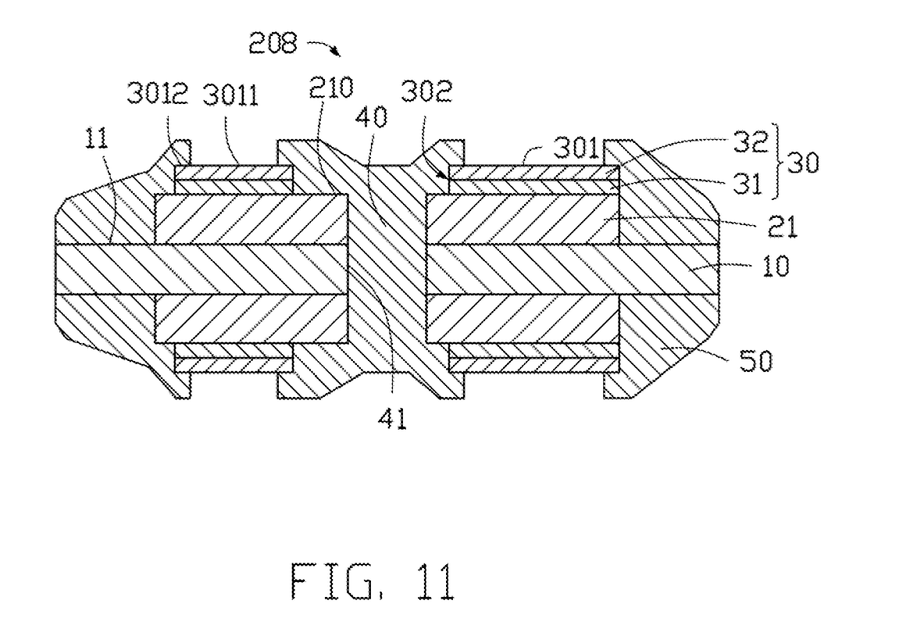
FIG. 11 is a diagrammatic view of the adhesive sheet and the second intermediate product of FIG. 10 being pressed together.

At block 108, referring to FIG. 11, the at least one adhesive sheet 207 and the second intermediate product 206 are pressed together, to have the at least one adhesive sheet 207 firmly attached to the second intermediate product 206. The at least one adhesive sheet 207 is thus changed to a covering film 50, and thereby a third intermediate product 208 is achieved. The covering film 50 covers the portion of the first surface 11 exposed through the conductive circuit layer 21, the exposing surface 210 of the conductive circuit layer 21, and the side surface 302 of the plating film 30. The covering film 50 fully fills the through hole 40. The third surface 301 includes a center area 3011, and an edge area 3012 placed around the center area 3011 and connected with the side surface 302.

In at least one exemplary embodiment, a size of the opening 2071 is equal to or smaller than the size of the center area 3011 of the third surface 301, thus the edge area 3012 of the third surface 301 can be covered by the covering film 50. The covering film 50 can firmly wrap the plating film 30 and the conductive circuit layer 21. The edge area 3012 of the third surface 301 covered by the covering film 50 can also increase the combinational strength between the covering film 50, the plating film 30, and the conductive circuit layer 21, to prevent easy detachment of the covering film 50.

In at least one exemplary embodiment, a length of the edge area 3012 in a direction from the edge of the third surface 301 toward the center of the third surface 301 is bigger than 0 and less than or equal to 0.23 mm.

Figure 12:
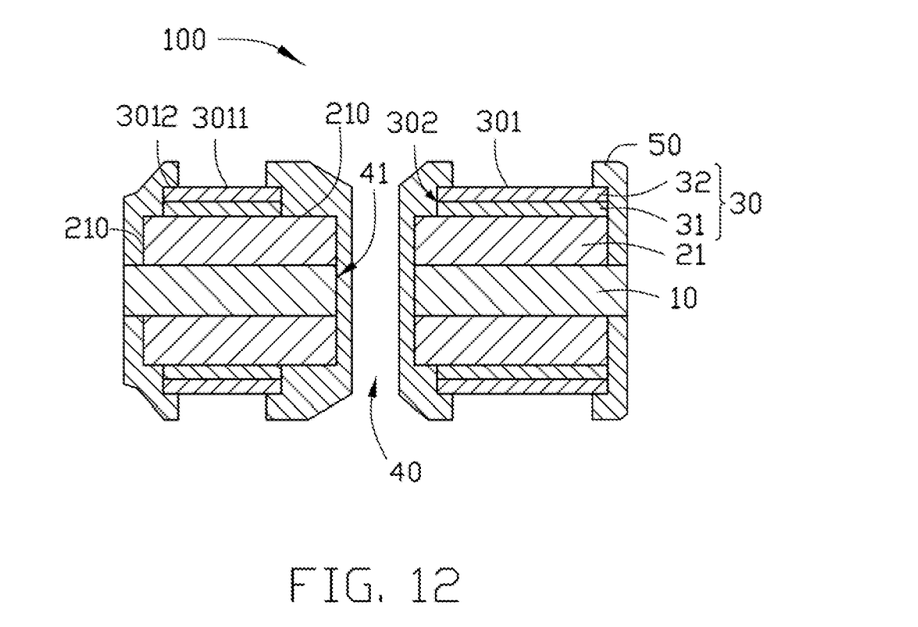
FIG. 12 is a diagrammatic view of a circuit board in accordance with an exemplary embodiment.

At block 109, referring to FIG. 12, the third intermediate product 208 is die-cut to remove a portion of the unattached substrate 10 (i.e. not attached with the conductive circuit layer 21), the covering film 50 attached to the portion of the unattached substrate 10 (i.e. not attached with the conductive circuit layer 21), and a portion of the covering film 50 infilling the through hole 40. A portion of the covering film 50 attached to the side wall 41 of the through 40 is left to remain. Thus a circuit board 100 is achieved.

In at least one exemplary embodiment, a thickness of the covering film 50 attached to the side wall 41 is equal to or bigger than 0.05 mm.

FIG. 12 illustrates a circuit board 100 used in an electronic device, such as a computer, a phone, a smart watch, or an electronic reader. In at least one exemplary embodiment, the circuit board 100 is a printed circuit board. The circuit board 100 includes a substrate 10, at least one conductive circuit layer 21 attached to the substrate 10, and at least one plating film 30 attached to a surface of the conductive circuit layer 21 away from the substrate 10.

The conductive circuit layer 21 has an exposing surface 210 which is not attached with the substrate 10 and the plating film 30.

The plating film 30 includes a third surface 301 away from the conductive circuit layer 21, and at least one side surface 302 connecting the third surface 301 and the conductive circuit layer 21.

In at least one exemplary embodiment, the plating film 30 includes a nickel layer 31 attached to a surface of the conductive circuit layer 21 away from the substrate 10, and a gold layer 32 attached to a surface of the nickel layer 31 away from the conductive circuit layer 21.

The circuit board 100 defines at least one through hole 40. The through hole 40 passes through the substrate 10, through the conductive circuit layer 21, and through the plating film 30. The through hole 40 has a side wall 41.

The circuit board 100 further includes a covering film 50. The covering film 50 covers the exposing surface 210 of the conductive circuit layer 21, the side surface 302 of the plating film 30, and the side wall 41 of the through hole 40. Thus the conductive circuit layer 21 and the side surface 302 of the plating film 30 are covered by the covering film 50. The conductive circuit layer 21 and the plating film 30 are thus isolated from any atmosphere, and cannot be corroded.

In at least one exemplary embodiment, a thickness of the covering film 50 attached to the side wall 41 is equal to or bigger than 0.05 mm.

The substrate 10 includes at least one first surface 11. The conductive circuit layer 21 is attached to the first surface 11.

A portion of the first surface 11 is exposed through the conductive circuit layer 21. The portion of the first surface 11 exposed through the conductive circuit layer 21 is covered by the covering film 50.

The third surface 301 includes a center area 3011, and an edge area 3012 placed around the center area 3011 and connected with the side surface 302. The covering film 50 further covers the edge area 3012 of the third surface 301.

In at least one exemplary embodiment, a length of the edge area 3012 in a direction from the edge of the third surface 301 toward the center of the third surface 301 is bigger than 0 and less than or equal to 0.23 mm.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A circuit board comprising: a substrate; at least one conductive circuit layer attached to the substrate; at least one plating film attached to a surface of each of the at least one conductive circuit layer away from the substrate, each of the at least one plating film comprises a surface away from each of the at least one conductive circuit layer, and at least one side surface connecting each of the at least one conductive circuit layer and the surface away from each of the at least one conductive circuit layer; and a covering film; wherein the circuit board defines at least one through hole, each of the at least one through hole passes through the substrate, the at least one conductive circuit layer, and each of the at least one plating film, the covering film covers an exposing surface of each of the at least one conductive circuit layer, the at least one side surface of each of the at least one plating film, and a side wall of each of the at least one through hole, wherein a portion of the surface of the substrate attached to each of the at least one conductive circuit layer is exposed through each of the at least one conductive circuit layer, the exposed portion of the surface of the substrate attached to each of the at least one conductive circuit layer is covered by the covering film.

2. The circuit board of claim 1, wherein the surface of each of the at least one plating film away from the at least one conductive circuit layer comprises a center area, and an edge area placed around the center area and connected with the side surface, the covering film further covers the edge area.

3. The circuit board of claim 2, wherein a length of the edge area in a direction from the edge of the surface of each of the at least one plating film away from the at least one conductive circuit layer toward the center of the surface of each of the at least one plating film away from the at least one conductive circuit layer is bigger than 0 and less than or equal to 0.23 mm.

4. The circuit board of claim 1, wherein a thickness of the covering film attached to the side wall is equal to or bigger than 0.05 mm.

5. The circuit board of claim 1, wherein each of the at least one plating film comprises a nickel layer attached to a surface of each of the at least one conductive circuit layer away from the substrate, and a gold layer attached to a surface of the nickel layer away from the at least one conductive circuit layer.

* * * * *

UNITED STATES PATENT AND TRADEMARK OFFICE
CERTIFICATE OF CORRECTION

PATENT NO. : 10,187,984 B1  
APPLICATION NO. : 15/817290  
DATED : January 22, 2019  
INVENTOR(S) : Ning Hou et al.

Page 1 of 1

It is certified that error appears in the above-identified patent and that said Letters Patent is hereby corrected as shown below:

On the Title Page

Please replace Item (73) regarding "Assignees" with the following:

(73) Assignees: Avary Holding (Shenzhen) Co., Limited., Shenzhen (CN); HongQiSheng Precision Electronics (QinHuangDao) Co.,Ltd., Qinhuangdao (CN)

Signed and Sealed this
Twenty-first Day of July, 2020

Andrei Iancu
*Director of the United States Patent and Trademark Office*